United States Patent [19]
Weiss

[11] Patent Number: 5,235,491
[45] Date of Patent: Aug. 10, 1993

[54] SAFETY POWER SUPPLY

[75] Inventor: Harald Weiss, Bremen, Fed. Rep. of Germany

[73] Assignee: Bicc-Vero Electronics GmbH, Fed. Rep. of Germany

[21] Appl. No.: 693,377

[22] Filed: Apr. 30, 1991

[30] Foreign Application Priority Data

May 10, 1990 [DE] Fed. Rep. of Germany ....... 4015030

[51] Int. Cl.$^5$ ............................................. H05K 7/20
[52] U.S. Cl. .................................... 361/694; 307/151; 363/141
[58] Field of Search .................. 363/141, 144; 357/81; 307/150, 151; 165/80.3, 179; 361/379, 381–384, 388, 395, 399, 417, 419, 427

[56] References Cited

U.S. PATENT DOCUMENTS

| | | | |
|---|---|---|---|
| 3,081,824 | 3/1963 | Macall | 165/179 |
| 3,277,346 | 10/1966 | McAdam et al. | 361/384 |
| 3,342,255 | 9/1967 | Risk et al. | 165/180 |
| 3,356,903 | 12/1967 | Arnold | 361/384 |
| 3,527,989 | 9/1970 | Cuzner et al. | 361/384 |
| 3,903,404 | 9/1975 | Beall et al. | 235/152 |
| 4,122,508 | 10/1978 | Rumbaugh | 361/384 |
| 4,639,834 | 1/1987 | Mayer | 361/388 |
| 4,967,155 | 10/1990 | Magnuson | 324/212 |
| 4,985,804 | 1/1991 | Campbell et al. | 361/384 |

FOREIGN PATENT DOCUMENTS

| | | |
|---|---|---|
| 0103412 | 3/1984 | European Pat. Off. |
| 2621705 | 12/1977 | Fed. Rep. of Germany |
| 2710432 | 9/1978 | Fed. Rep. of Germany |
| 3223624 | 1/1984 | Fed. Rep. of Germany |
| 8509176 | 7/1985 | Fed. Rep. of Germany |
| 3638251 | 5/1988 | Fed. Rep. of Germany |
| 3710198 | 10/1988 | Fed. Rep. of Germany |
| 2606581 | 5/1988 | France |
| 586145 | 2/1977 | Switzerland |
| 1438609 | 6/1976 | United Kingdom ................. 361/384 |
| 2059569 | 4/1981 | United Kingdom ................. 361/384 |

OTHER PUBLICATIONS

Copy of catalog in German-Schroff 19"-Aufbausysteme für die Elektronik-Industrie, pp. G52 and G53, Jul. 1984.

Primary Examiner—Gerald P. Tolin
Attorney, Agent, or Firm—Eckert Seamans Cherin & Mellott

[57] ABSTRACT

Power supplies are known, in particular power supplies under primary clock-pulse control, that comprise a closed housing for the primary and secondary circuits, and a forced-air cooling means to cool the heat-producing components of the circuits. A power supply is proposed in which additionally there is a ventilation conduit in communication with the air outside the housing to serve as a cooling medium. The cooling means also comprises at least one cooling-unit element, on which the heat-producing components are mounted, and a portion of said element projects into the ventilation conduit and is electrically isolated by insulating means.

14 Claims, 9 Drawing Sheets

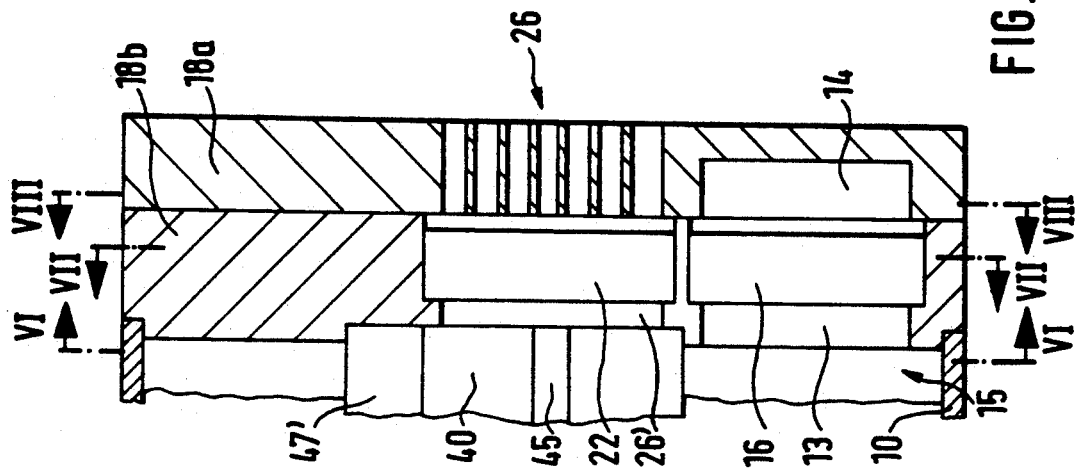
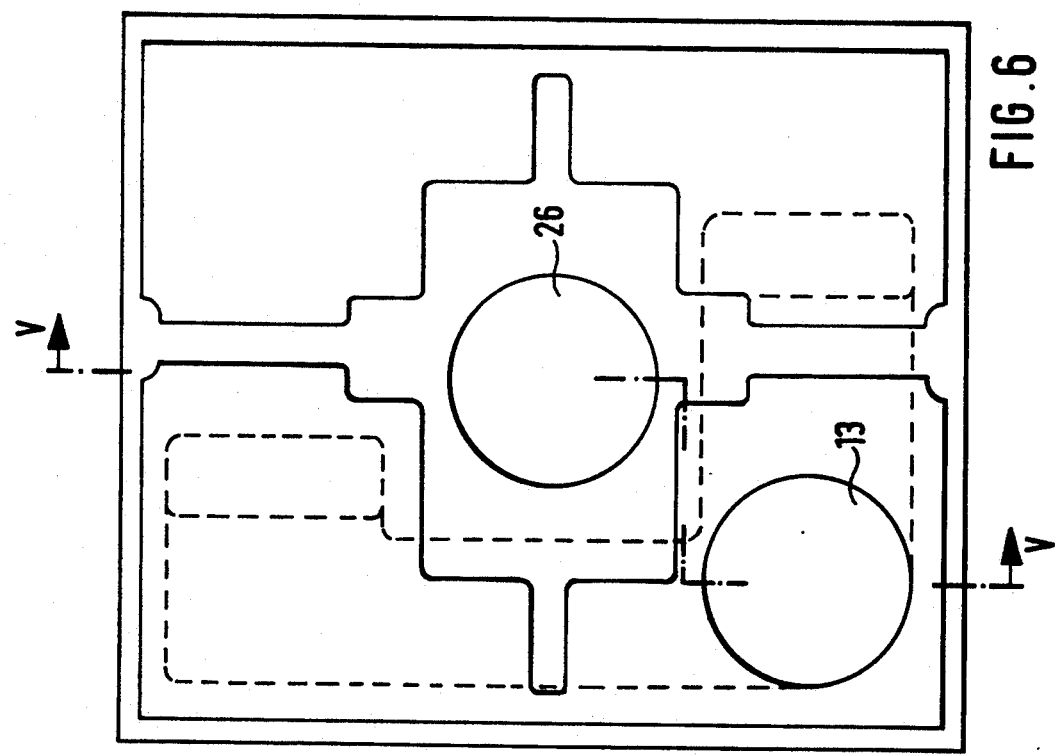

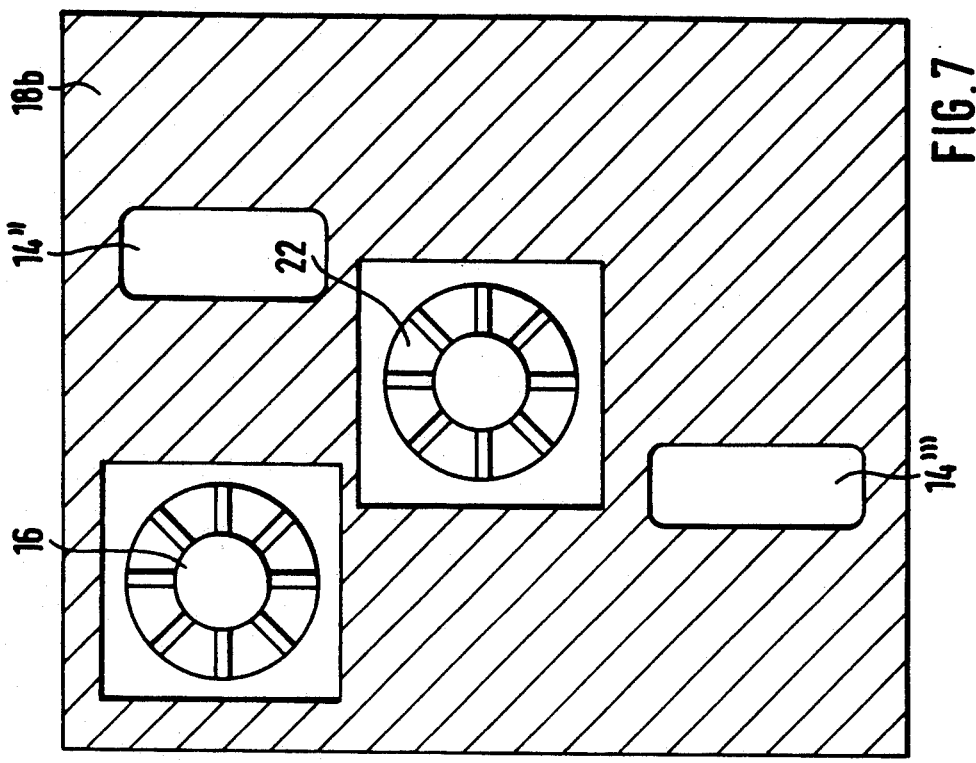
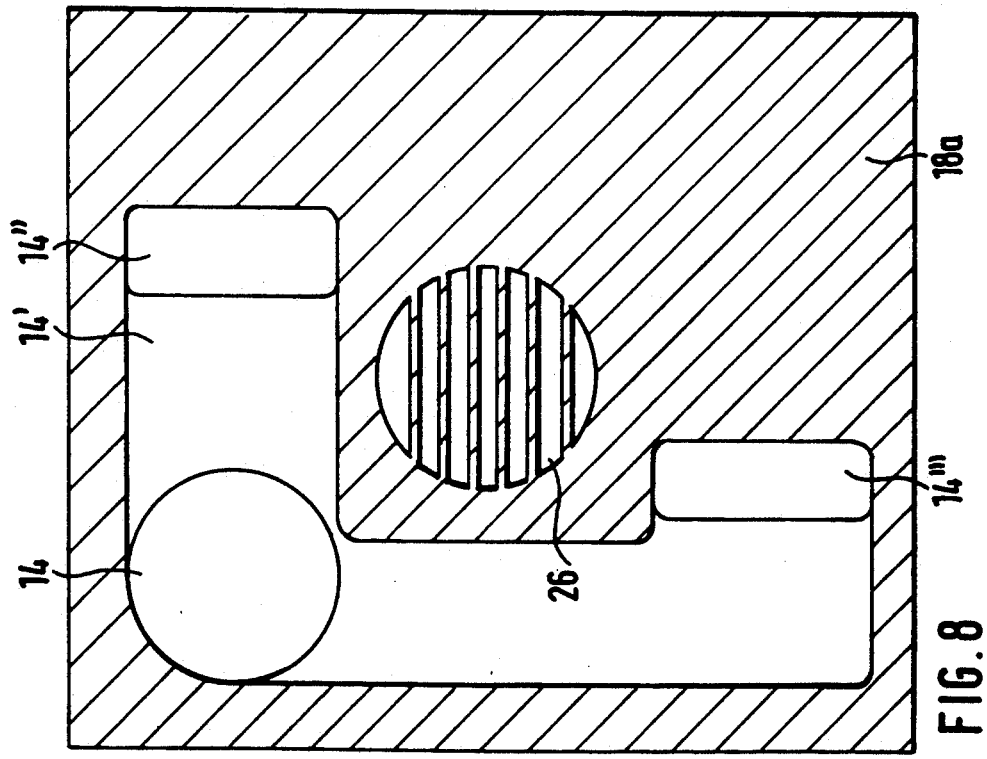

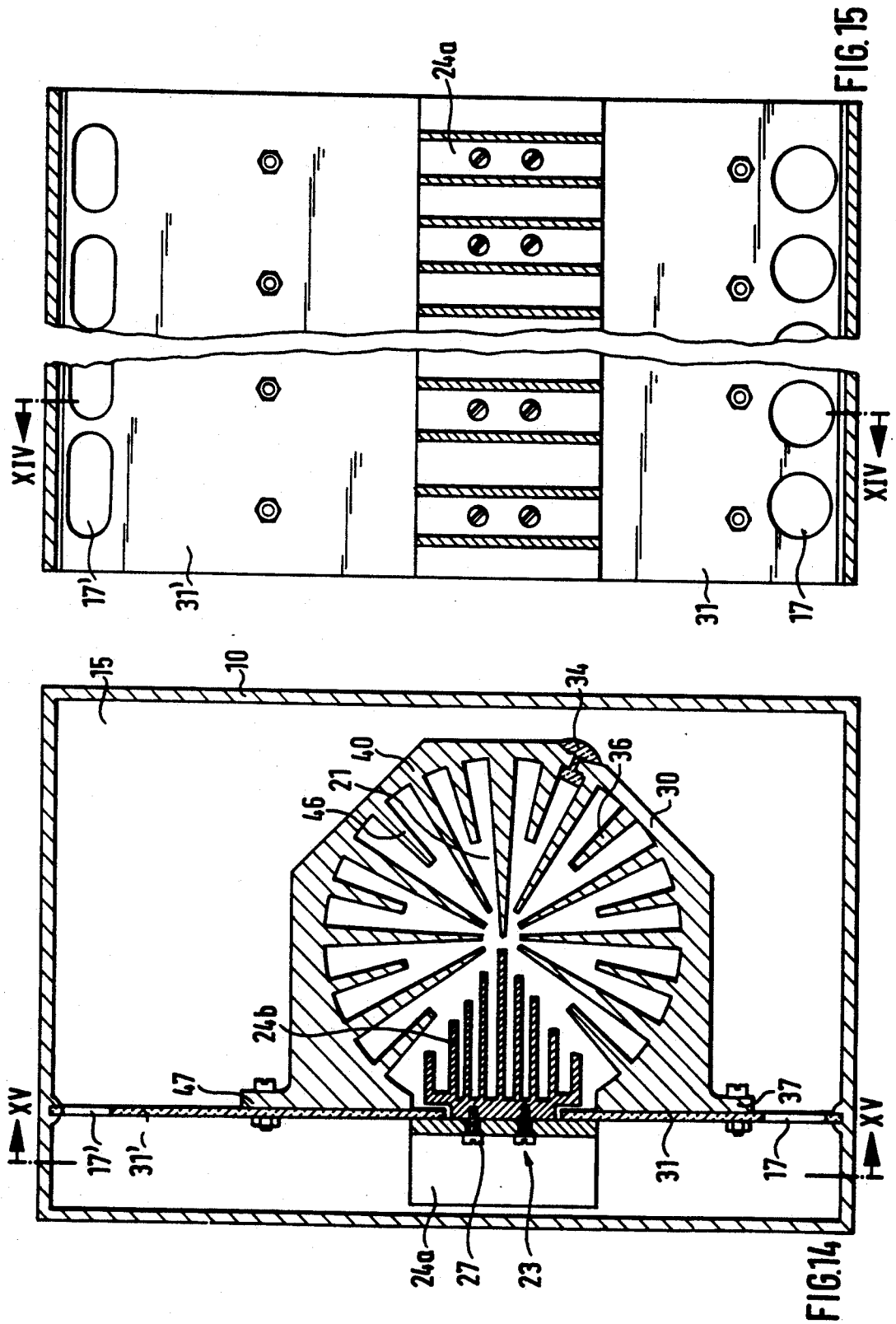

SAFETY POWER SUPPLY

FIELD OF THE INVENTION

The present invention relates to a safety power supply. In particular, it relates to a power supply under primary clock-pulse control.

DESCRIPTION OF THE PRIOR ART

Power supplies under primary clock-pulse control are coming into increasingly common use because of their high efficiency and small structural volume. The problem with such power supplies is that in many cases they must comply with various safety requirements, involving especially the electrical separation of their primary and secondary circuits and the necessity of shielding them from external contact. The latter requirement is particularly difficult to meet in the case of high-wattage power supplies generating large amounts of heat, which must be dissipated by cooling units on which semiconductor components are mounted. The difficulty arises especially from the fact that to achieve optimal heat transfer the semiconductor components should be mounted in direct contact with the cooling unit, with no intervening insulation. Therefore the cooling unit must necessarily be at the same potential as the semiconductor housing. Furthermore, air should circulate as freely as possible between the cooling unit and the surroundings, for effective heat removal. However, the necessary shielding from external contact generally prevents such free circulation.

SUMMARY OF THE INVENTION

An object of the present invention is to provide a power supply in which good heat dissipation is achieved while, at the same time, stringent safety requirements are met.

According to the present invention there is provided a power supply with primary clock-pulse control comprising a closed housing, a primary circuit with heat-producing components, a secondary circuit with heat-producing components, a ventilation conduit in communication with air outside the housing to act as the cooling medium, and a forced-air cooling means, which comprises at least one cooling-unit element so disposed that it is inaccessible from outside the housing and on which said heat-producing components of said primary and secondary circuits are mounted, and insulating means for electrically isolating a portion of said cooling-unit element projecting into the ventilation conduit.

An important aspect of the invention is that the ventilation conduit itself provides protection against electrical contact.

The ventilation conduit preferably run within the housing and is tightly sealed off from the latter, so that the safety power supply can be used even in rooms where there is danger of explosion or where humidity is high.

In addition, the number of structural parts of the power supply can be kept particularly low, with an improvement in heat dissipation, by a construction in which sections of the cooling-unit element itself form the ventilation conduit.

In the invention, the portions of the cooling-unit element that form the ventilation conduit for the primary and the secondary circuits are arranged one behind the other; this is possible owing to the fact that the primary and secondary circuits in general differ in the amounts of heat they produce. As an alternative, it is possible to construct the cooling-unit element in electrically isolated sections, each of which forms part of the circumference of the ventilation conduit. In this case the surface area of the cooling-unit element is chosen to correspond to the amount of heat that must be dissipated.

Space is utilized especially effectively when the ventilation conduit passes through the housing across its central space. Here, either ambient air can flow into the conduit on one side of the housing and out on the other side, or the inlet and outlet of the ventilation conduit can be positioned on the same side or wall of the housing. In the latter case, the preferred arrangement is to place an air directing device, such as a louver or the like, at the outlet in such a way that no short-circuiting of the air current can occur.

Heat is produced not only by the components mounted directly on the cooling-unit element but also by other active and passive components within the housing. Preferably, therefore, the cooling means will be constructed so that heat from the interior of the housing can be conducted into the ventilation conduit. For this purpose a means is provided to cause the air in the interior to circulate. This circulation can be accomplished by an appropriate arrangement of the heat-dissipating components within the housing and the provision of passages for thermal or motor-driven airflow.

Preferably, the cooling means will include a separate heat-exchange cooling unit to transfer the heat from the interior of the housing into the ventilation circuit. With such a system, a particularly low temperature within the housing can be achieved.

It is advantageous to manufacture the cooling-unit element and the heat-exchange cooling unit as extrusion-press profiles in which any cooling fins are parallel to the direction of the airstream. The insulators, by which multiple cooling-unit elements are electrically isolated from one another and from the housing, are preferably constructed so as to bear the printed circuits on which the electronic components of the primary and secondary circuits are assembled.

The safety of a power supply with a ventilation conduit in close proximity to the housing can be further increased by filling the interior of the housing with an inert gas, for example nitrogen. In addition, a pressure monitor can be installed in the power supply to measure the pressure difference between the interior and the surroundings, to prevent the operation of the power supply and to produce a warning signal when the pressure difference between interior and exterior of the housing falls below a predetermined level.

BRIEF DESCRIPTION OF THE DRAWINGS

FIG. 5 is a partial section through an end region of a third embodiment of the invention in a view similar to that shown in FIG. 1;

FIGS. 6 to 8 are sections along the lines VI—VI to VIII—VIII in FIG. 5 respectively;

FIG. 14 is a cross section of a fifth embodiment of the invention in a view similar to that shown in FIG. 2;

FIG. 15 is a section along the line XV—XV in FIG. 14; and

DESCRIPTION OF THE PREFERRED EMBODIMENTS

In the following description the same reference numbers are used for the same components or for components with the same action in all the described embodiments.

Figure 1:
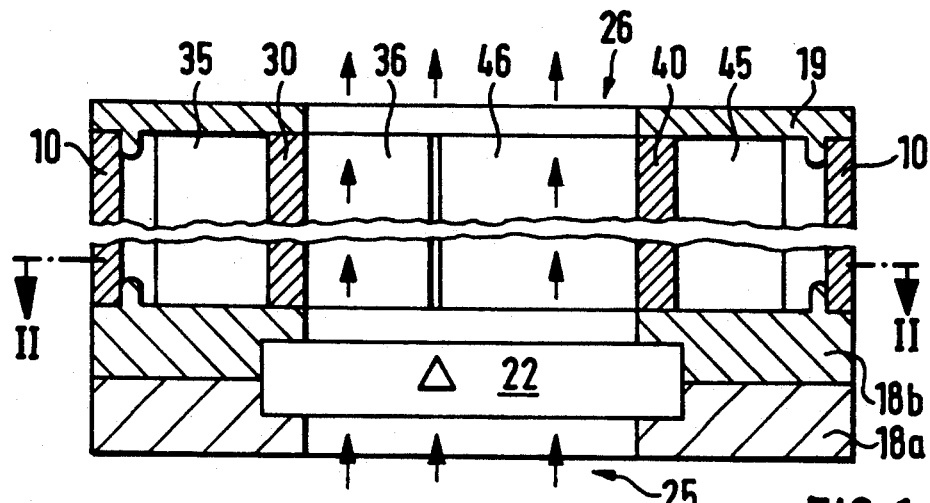
FIG. 1 is a partial horizontal section of a first embodiment of the invention.
Figure 2:
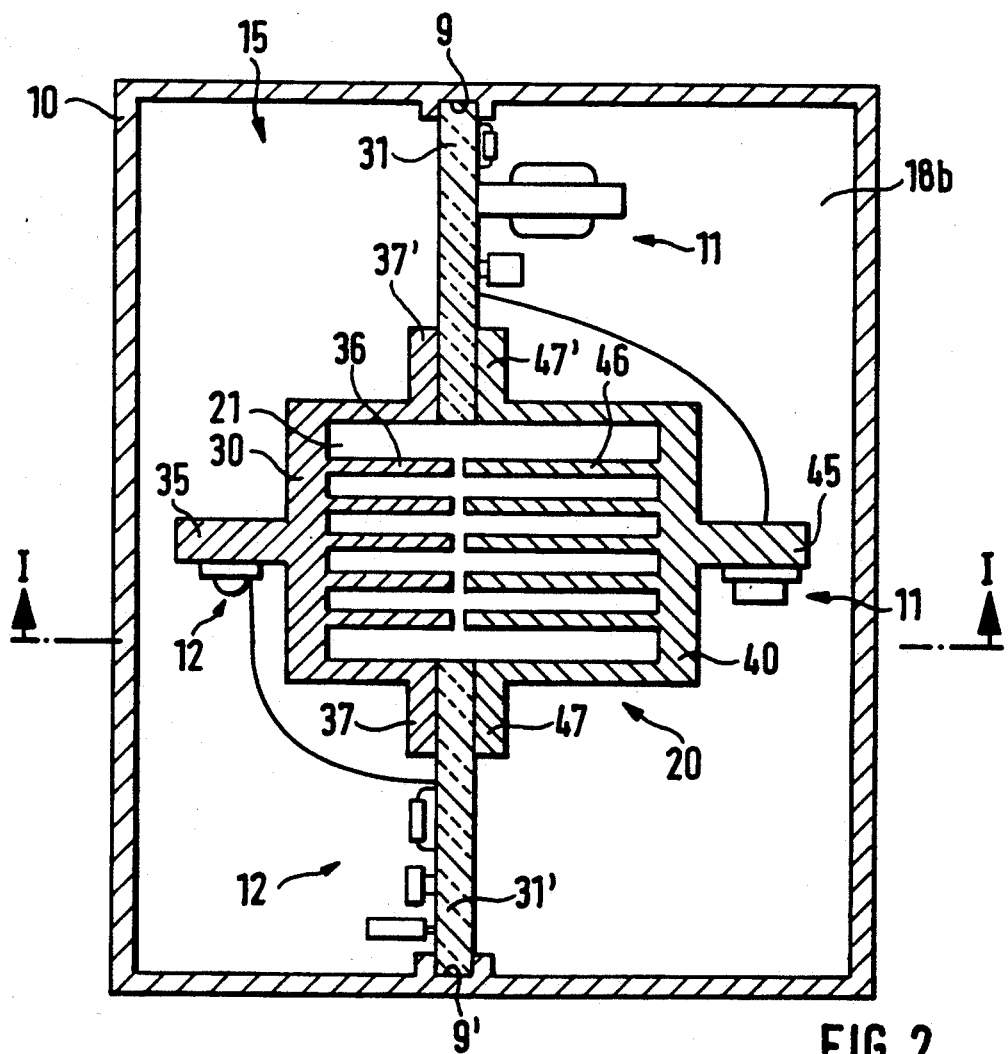
FIG. 2 is a section along the line II—II in FIG. 1.

In the first embodiment of the invention, illustrated in FIGS. 1 and 2, the safety power supply comprises a tubular housing 10 closed at its ends by end-caps 18a, 18b and 19. One of the end-caps comprises two shells 18a and 18b, between which a ventilator 22 is clamped. The ventilator 22 can draw air through an inlet 25 in the outer shell 18a and blow the air into a ventilation conduit 21 through a corresponding opening in the inner shell 18b. After passing through the ventilation conduit 21 the air returns to the outside by way of an outlet 26 in the second end-cap 19.

The ventilation conduit 21 is formed, as shown in FIG. 2, by two cooling-unit elements 30 and 40, which are fixed by way of attachment flanges 37, 37' and 47, 47', respectively, to opposite surfaces of insulating plates 31, 31'. The profile of the cooling-unit elements 30, 40 is such that, while forming the wall of the ventilation conduit 21, the elements 30, 40 also bear cooling fins 36, 46 that project into the conduit 21.

The cooling-unit elements 30, 40 are additionally equipped with mounting flanges 35, 45 on which heat-producing components 11 and 12 of primary and secondary circuits, respectively, can be mounted.

The insulating plates 31, 31', to which the cooling unit elements 30, 40 are attached, are seated by their opposite edges in grooves 9, 9' in the housing 10.

The end-caps 18a, 18b and 19 are so closely joined to the housing 10 and the cooling-unit elements 30, 40 that they form an airtight seal between the interior space 15 of the housing 10 and the atmosphere outside the housing, as well as between the interior space and the ventilation conduit 21.

The plates 31, 31' have two functions: they hold the cooling unit 20 (formed by the elements 30 and 40) in a fixed position relative to the housing 10, and they also divide the cooling unit 20 so that the two elements are electrically insulated from one another, with the result that the components 11 of the primary circuit are electrically insulated from the components 12 of the secondary circuit, despite the primary and secondary components being mounted directly on the elements 30 and 40, respectively. Furthermore, the plates 31, 31' simultaneously serve as printed circuit mounting boards for the remaining components, which produce less heat.

Figure 3:
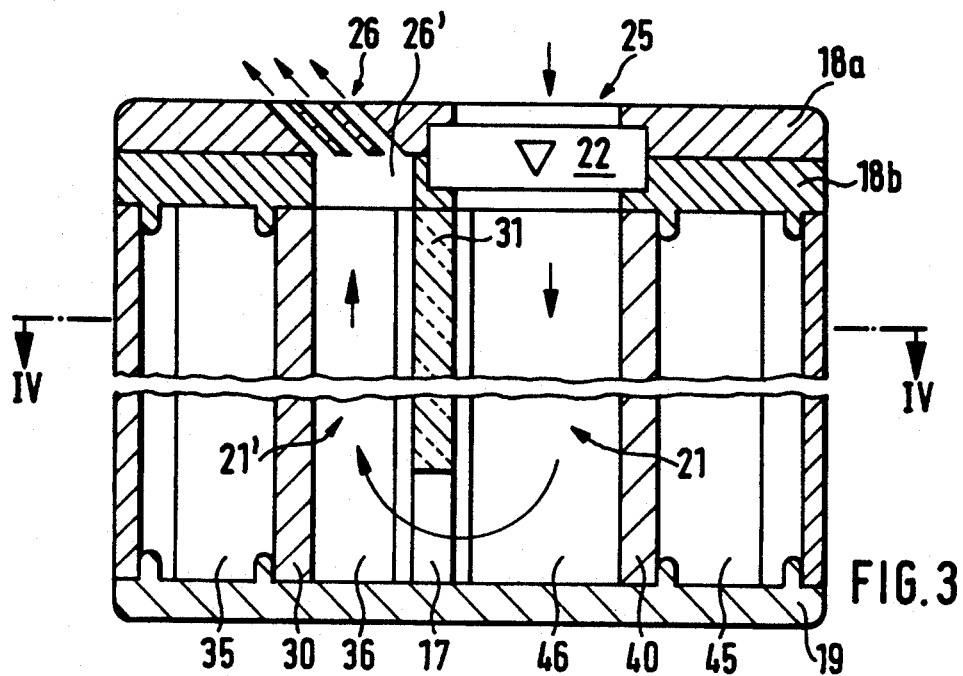
FIG. 3 is a partial horizontal section of a second embodiment of the invention.
Figure 4:
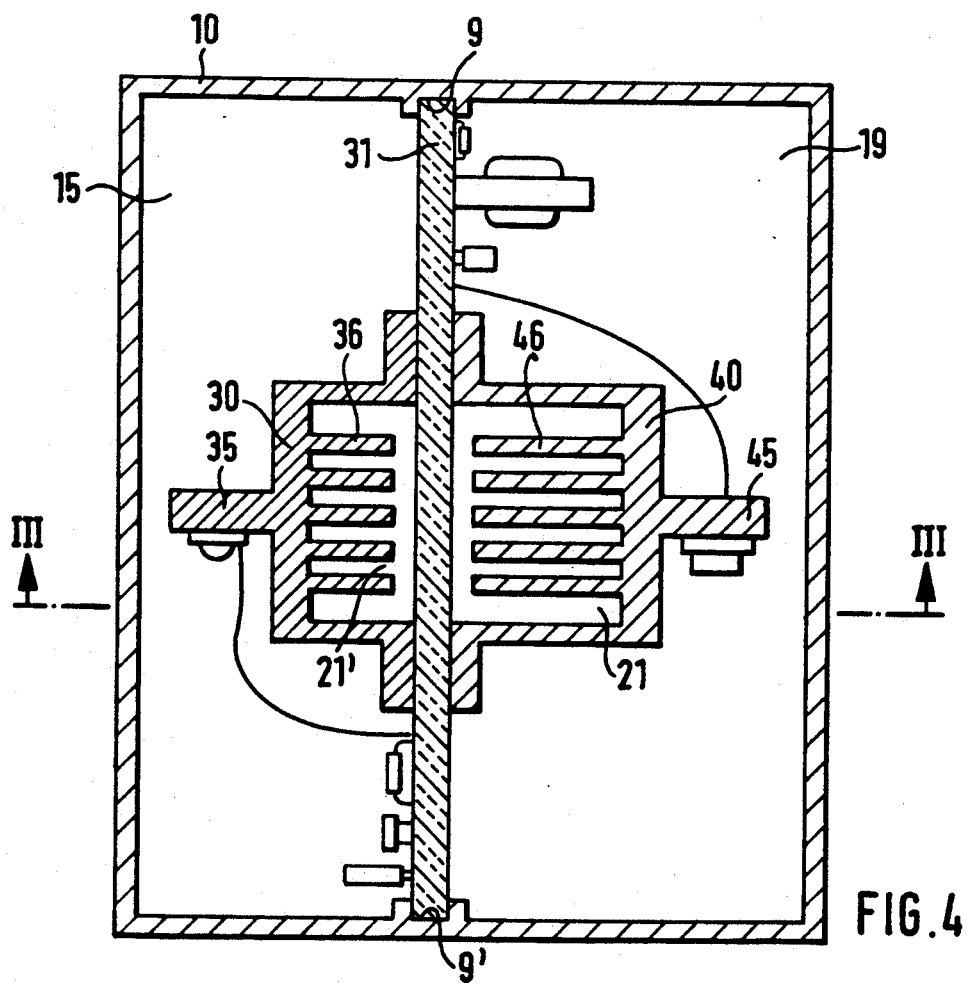
FIG. 4 is a section along the line IV—IV in FIG. 3.
Figure 9:
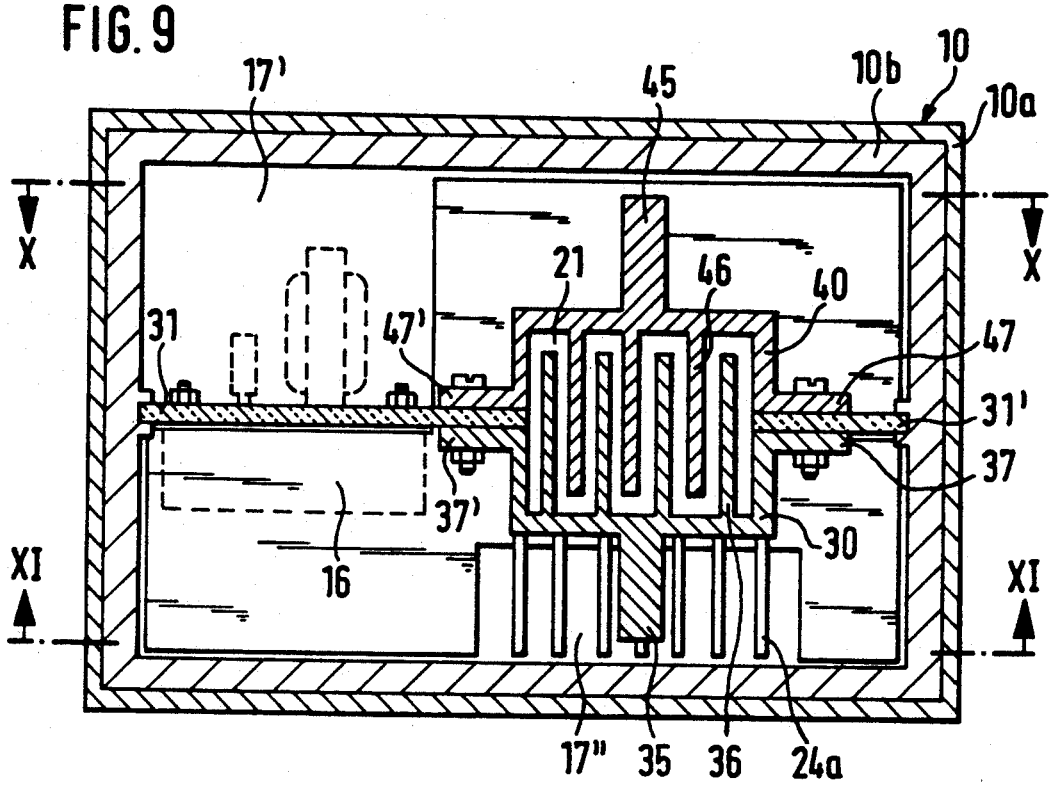
FIG. 9 is a partial horizontal section of a fourth embodiment of the invention similar to that shown in FIG. 2.
Figure 12:
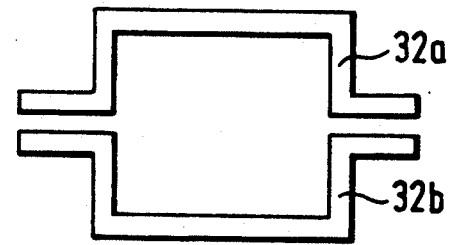
FIGS. 12 and 13 are plan views of individual components of the fourth embodiment shown in FIGS. 9-11.
Figure 13:
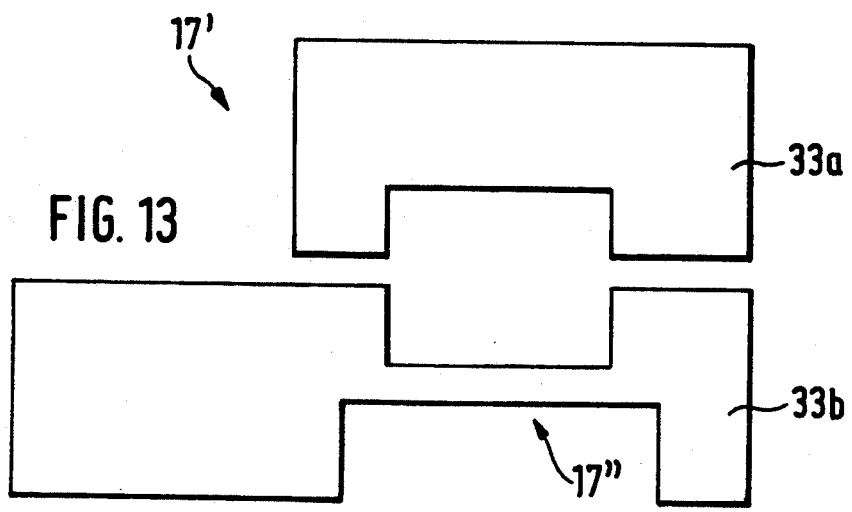

In the variant of the invention illustrated in FIGS. 3 and 4, a single plate 31 is provided that extends over the entire height of the housing 10, so that it divides the ventilation conduit into a first compartment 21 and a second compartment 21'. The two compartments 21, 21' communicate with one another through an aperture in plate 31, at the end of the plate opposite the inlet 25 of the ventilator 22. The end-cap 19, in contrast to the embodiment previously described, has no opening, whereas in the two-shelled end-plate 18a, 18b there is an outlet 26, 26' next to the inlet 25, said outlet being in communication with conduit compartment 21'. The outlet segment 26 is equipped with louvers that direct the outflow of the warmed coolant air in such a way that it is not drawn back into the inlet 25. In other respects this embodiment is essentially the same as that previously disclosed.

In the third embodiment of the invention illustrated in FIGS. 5 to 8, the basic structure of the housing 10, the cooling-unit elements 30, 40 and the plates 31, 31' is as shown in FIG. 2. The essential difference between this third embodiment and the first embodiment of the invention lies in the structure of the end-cap 18a, 18b which includes not only the ventilator 22 as previously described, to drive air through the ventilation conduit 21, but also a ventilator 16 to circulate the volume of air in the interior 15 of the housing 10. The ventilator 16 is located between the two shells 18a and 18b and communicates with the housing interior 15, on the suction side by way of an inlet 13 and on the pressure side by way of outlet channels 14' in the outer shell 18a and the outlet openings 14", 14''' in the inner shell 18b, so that the interior air is drawn in at one place within the housing and blown out at other places. The plate 31', similar to that shown in FIG. 2, has an aperture in the end away from the end-cap 18a, 18b so that air sent through outlet 14" by the ventilator 16 can pass through this aperture and be sucked in again by the ventilator 16. The air emerging from the outlet 14''' flows through the gap between the mounting flange 35 and the inner wall of the housing (see FIG. 2) to reach the inlet 13 of the ventilator 16. In this way the air in the interior space 15 is circulated and can be cooled by way of the outer surfaces of the cooling-unit elements 30 and 40.

In a fourth embodiment now described with reference to FIGS. 9-13, the ventilation conduit 21 passes through the housing as in the embodiment shown in FIGS. 1 and 2, and a ventilator inlet is incorporated into the end-cap 18, whereas the corresponding air outlet is situated in the end-cap 19 that is integral with the housing 10.

Figure 10:
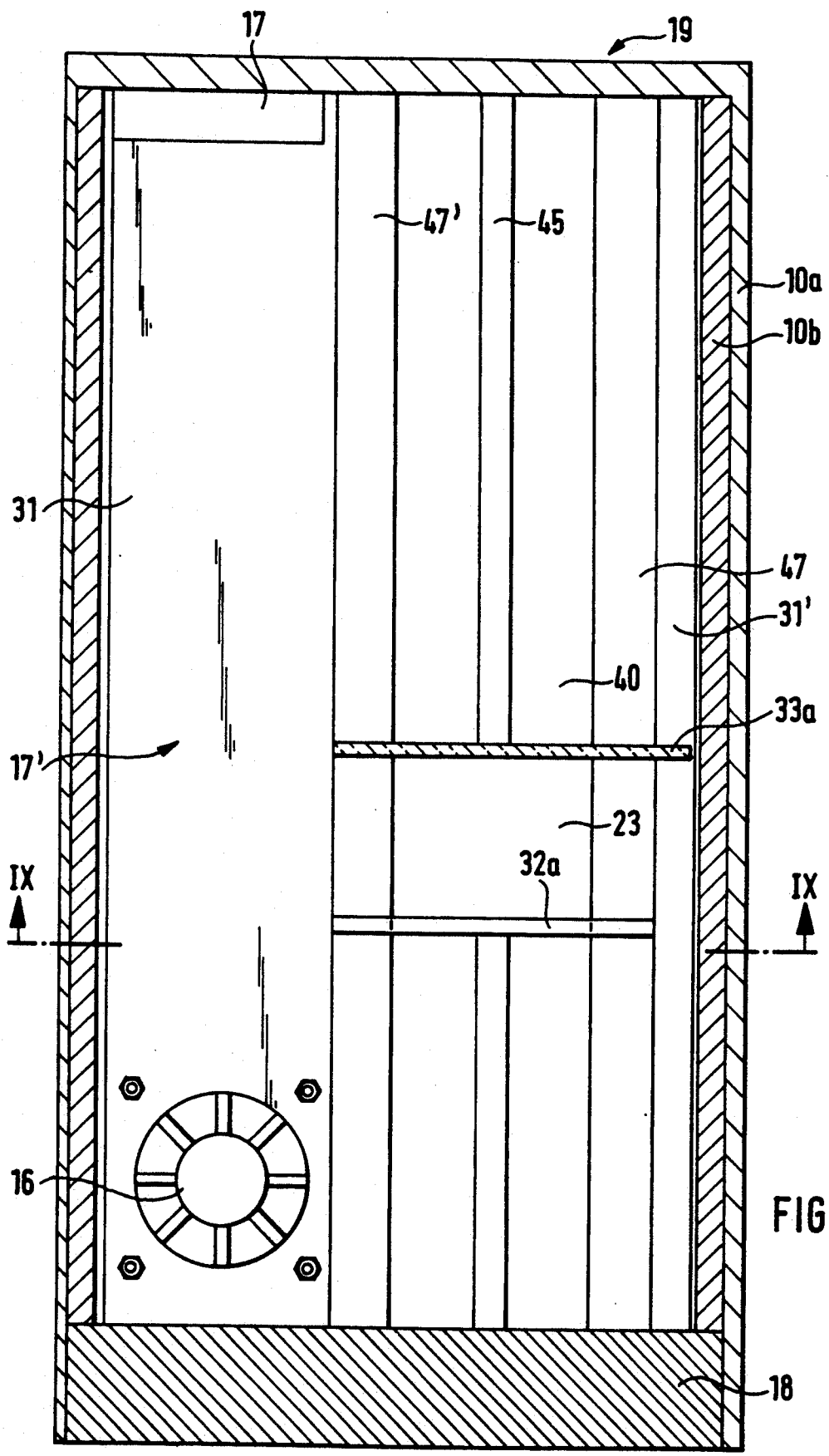
FIGS. 10 and 11 are sections along the lines X—X and XI—XI in FIG. 9 respectively.
Figure 11:
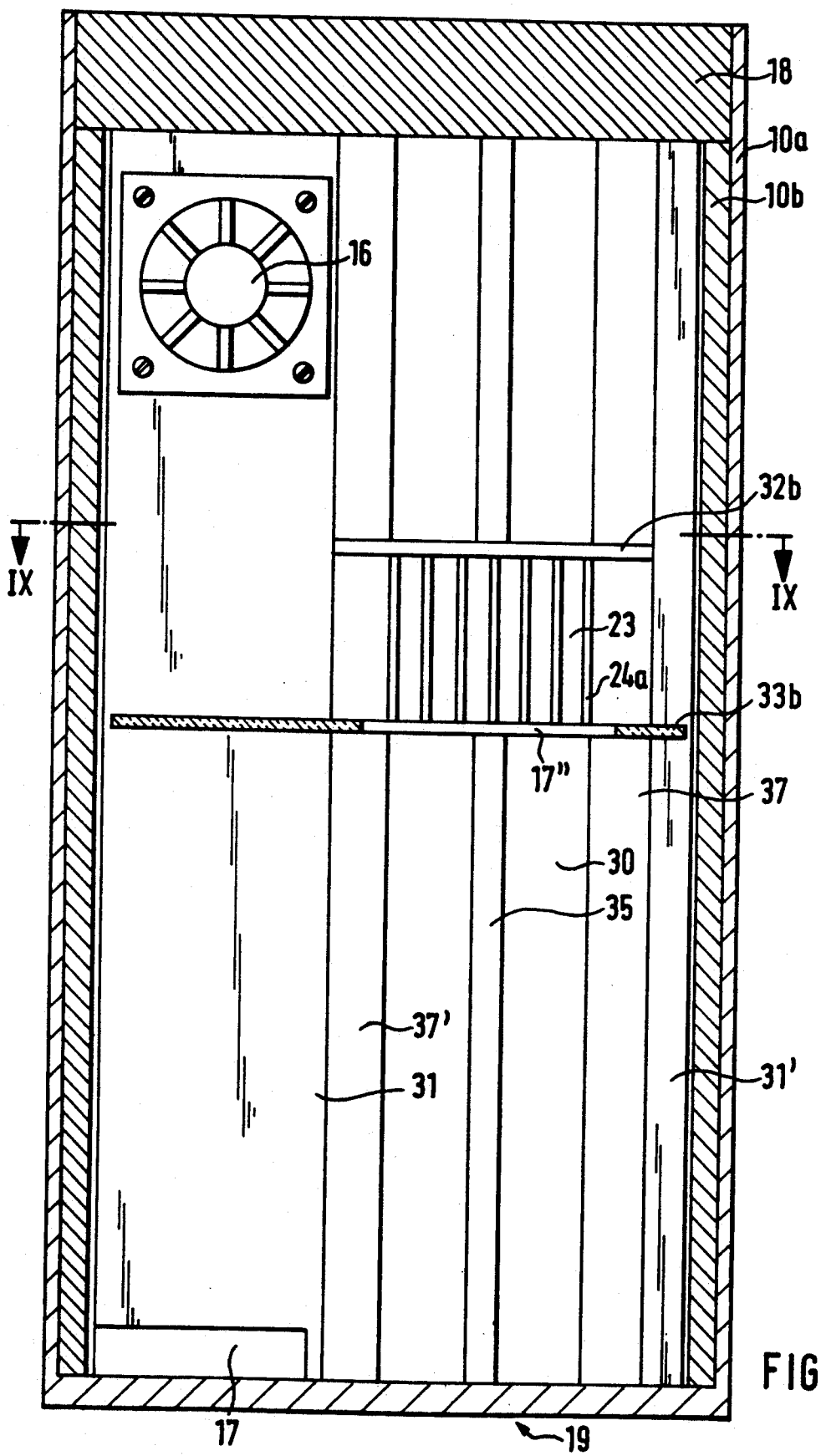

Another difference from the first embodiment of the invention is that the cooling-unit elements 30 and 40 occupy a smaller part of the length of the conduit 21, another part of the length of conduit 21 being formed by an additional cooling unit 23, which is electrically isolated from the cooling-unit elements 30, 40 by insulating plates 33a and 33b but connected to it in such a way that the joint is airtight. FIGS. 10 and 11 show an embodiment in which another cooling element is added next to the cooling unit 23 and insulated from it by insulation plates 32a, 32b, so as to complete the full length of the ventilation conduit 21.

The cooling unit 23 has fifteen fins 24 that project into the interior of the housing 15, so that it serves as a heat exchanger between the housing interior 15 and the ventilation conduit 21.

To produce circulation of the air in the housing interior, a ventilator 16 is incorporated into the plate 31 at the end near the end-cap 18, and an air aperture 17 is provided at the other end, near the end-wall 19.

The insulation plate 33b, which provides the electrical insulation between the heat-exchange cooling unit 23 and cooling-unit element 30, has an opening 17" near the fins 24a of cooling element 23. The other insulation plate 33a, which separates the heat-exchange cooling unit 23 from the cooling-unit element 40, extends only over the full width of section 40, leaving open a passage for air flow 17'.

In this arrangement, the air blown out by the interior ventilator 16 can circulate through the housing interior as shown in FIG. 11, from top to bottom, first passing the electrical components and thence flowing through the opening 17', the aperture 17 and, on the other side of plate 31, through the opening 17", and finally passing along the fins 24a of the heat-exchange cooling unit 23, where it is cooled. Then it is sucked in again by the ventilator 16.

A fifth embodiment of the invention is now described with reference to FIGS. 14 and 15.

In this embodiment of the invention, the cooling-unit elements 30 and 40 enclose a ventilation conduit 21 with an essentially circular cross section, into which the cooling fins 36 and 46 of the elements 30 and 40 respectively project radially. The cooling-unit elements 30 and 40 are connected to one another by way of a piece of insulation material 34, making a mechanically firm and air-tight joint that separates the elements electrically. The elements 30 and 40 are attached by their attachment flanges 37 and 47 to plates 31, 31'. The plates 31, 31' extend toward one another beyond the elements 30 and 40, with a gap between their opposed edges. The heat-exchange unit for cooling the interior of the housing is mounted in this gap. It consists of two parts, of which the one on the side toward the ventilation conduit bears cooling fins 24b, which project into the ventilation conduit 21 and are oriented parallel to its long axis, whereas the part on the outside of the ventilation conduit, firmly attached to the inner part by screws 27, bears cooling fins 24a arranged perpendicular to the inner cooling fins 24b.

Air passes through the plates 31, 31' by way of the apertures 17, 17'. The air movement is produced by thermal convection, because no heat-producing components are mounted on the heat-exchange cooling element and its fins 24a are therefore colder then the cooling elements 30, 40. Hence air cooled by the fins 24a flows downward, through the apertures 17 into the interior 15 of the housing 10, upward in the space between the housing 10 and the cooling-unit element 40, and finally through the apertures 17' into the space behind plate 31'.

Figure 16:
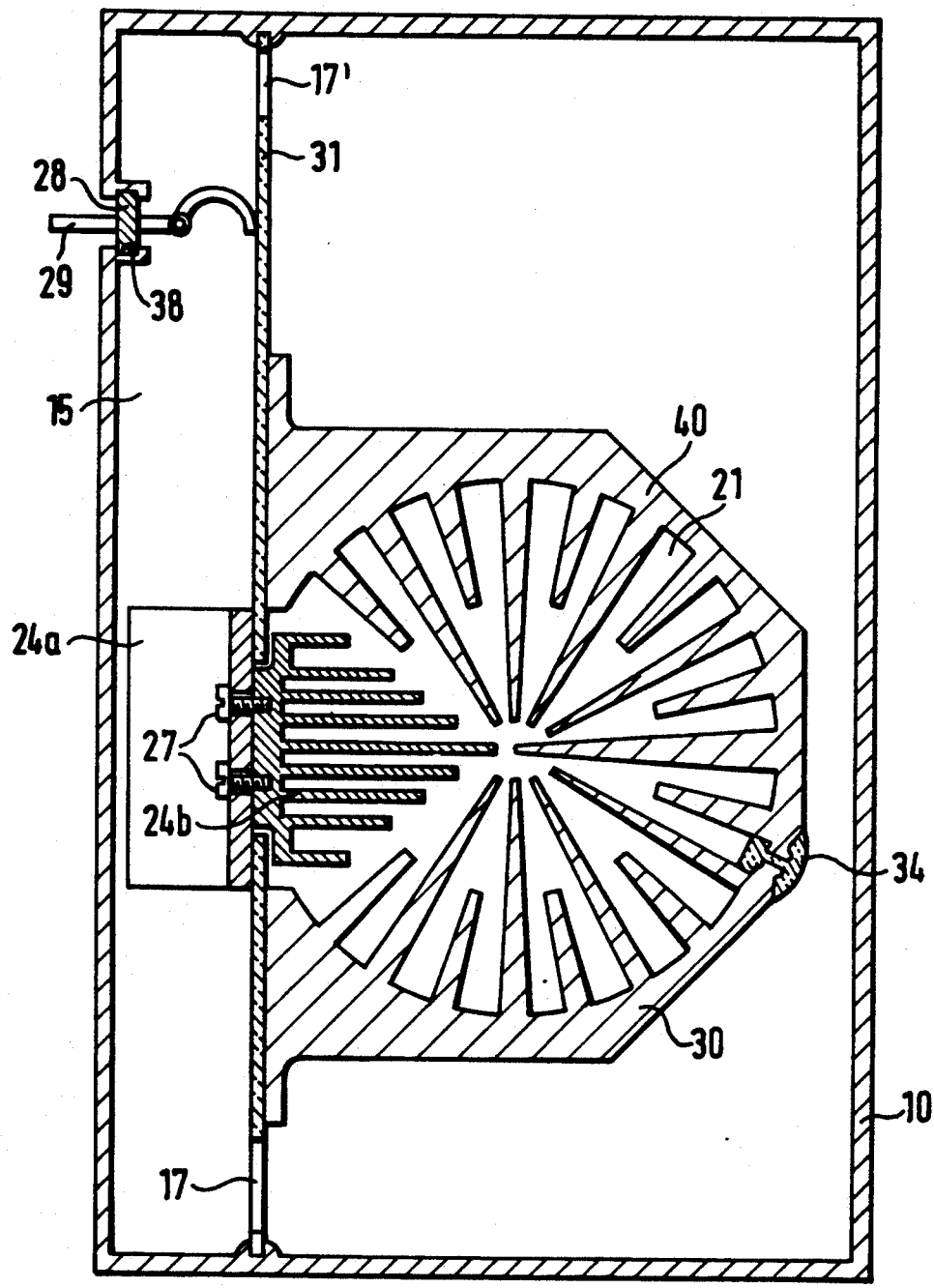
FIG. 16 is a cross section through a sixth embodiment of the invention in a view similar to that shown in FIG. 14.

A modification of the embodiment illustrated in FIGS. 14 and 15 is shown in FIG. 16. Here, a slot 38 is provided in one wall of the housing 10, in which is mounted a electric conductor rail 28, the contacts 29 of which project out of the housing 10 and in the housing interior 15 are connected to conducting tracks on the plate 31.

The elements 30, 40 and the cooling-unit 23 in the preceding description, like the housing 10, are preferably made of aluminum extrusion-pressed material. The housing 10 can also be constructed as a double shell, as in the embodiment shown in FIGS. 9 to 11, so that it will both shield against interfering radiation, from inside to outside as well as conversely, by the use of a material with the appropriate conductance, and provide electrical insulation against external contact.

We claim:

1. A switching power supply having a primary clock-pulse control comprising:
   a closed housing;
   a primary power supply circuit with first heat producing components within said housing;
   a secondary power supply circuit with second heat producing components within said housing;
   a ventilation conduit disposed within said housing for communicating with air outside the housing, said air acting as a cooling medium;
   a forced-air cooling means disposed within said housing, said cooling means having first and second cooling elements mounting said first and second heat producing components, respectively, said forced air cooling means projecting into said ventilation conduit and inaccessible from outside of said housing; and,
   insulating means separating said first from said second cooling elements.

2. A power supply as recited in claim 1, wherein said ventilation conduit passes through the interior of said housing and is separated therefrom by an air-tight seal.

3. A power supply as recited in claim 1, wherein said cooling elements define said ventilation conduit.

4. A power supply as recited in claim 1, wherein said ventilation conduit is at least partly bounded by said cooling elements.

5. A power supply as recited in claim 1, wherein said first and second cooling elements are disposed one behind the other, with respect to a direction of air flow.

6. A power supply as recited in claim 1, wherein said ventilation conduit is disposed from a side of said housing to another side of said housing.

7. A power supply as recited in claim 1, wherein said ventilation conduit has two parts and defines an inlet opening and an output opening, said openings each disposed on a same side of housing.

8. The power supply as recited in claim 1, wherein said cooling means directs heat generated in an interior of said housing into said ventilation conduit.

9. The power supply as recited in claim 8, further comprising means for circulating the air in said interior of said housing.

10. The power supply as recited in claim 8, wherein said cooling means has a heat-exchange unit which conducts heat from the interior space of said housing into said ventilation conduit.

11. The power supply as recited in claim 10, wherein said heat-exchange unit comprises sheet metal.

12. The power supply as recited in claim 1, wherein at least one of said cooling elements and said housing comprises sheet metal.

13. The power supply as recited in claim 1, wherein said insulating means comprises a printed-circuit board having thereon at least part of said primary or secondary circuit.

14. The power supply as recited in claim 1, wherein an interior of said housing is filled with an inert gas.

* * * * *